(12) United States Patent
Han

(10) Patent No.: US 10,342,146 B2
(45) Date of Patent: Jul. 2, 2019

(54) DISPLAY DEVICE

(71) Applicant: Samsung Display Co., Ltd., Yongin-si, Gyeonggi-do (KR)

(72) Inventor: Jiwon Han, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/677,979

(22) Filed: Aug. 15, 2017

(65) Prior Publication Data

US 2018/0098442 A1 Apr. 5, 2018

(30) Foreign Application Priority Data

Oct. 4, 2016 (KR) .................. 10-2016-0127784

(51) Int. Cl.

| H05K 5/00 | (2006.01) |
|---|---|
| H05K 7/00 | (2006.01) |
| H05K 5/02 | (2006.01) |
| H04M 1/02 | (2006.01) |
| H04M 1/18 | (2006.01) |
| G06F 1/16 | (2006.01) |

(52) U.S. Cl.
CPC ......... *H05K 5/0217* (2013.01); *G06F 1/1637* (2013.01); *G06F 1/1652* (2013.01); *H04M 1/0266* (2013.01); *H04M 1/185* (2013.01); *H05K 5/0017* (2013.01); *G02F 2201/50* (2013.01)

(58) Field of Classification Search
CPC ........................................ H05K 5/00
See application file for complete search history.

(56) References Cited

U.S. PATENT DOCUMENTS 9,380,714 B2 6/2016 Shin et al.
2015/0378391 A1* 12/2015 Huitema ................. G06F 1/163
361/679.03

FOREIGN PATENT DOCUMENTS

| KR | 10-2013-0121297 A | 11/2013 |
|---|---|---|
| KR | 10-2014-0136598 A | 12/2014 |
| KR | 10-1480454 B1 | 1/2015 |
| KR | 10-2016-0077822 A | 7/2016 |

* cited by examiner

*Primary Examiner* — Jerry Wu
(74) *Attorney, Agent, or Firm* — Lewis Roca Rothgerber Christie LLP

(57) ABSTRACT

Provided is a display device including a first protection member including a flat part, in which a central area and a surrounding area that is adjacent the central area are defined, and a support part on the surrounding area of the flat part, and protruding upward from the flat part, a display module on the first protection member for displaying an image, and a second protection member between the first protection member and the display module, on the support part, and spaced a distance from the flat part to define a space on the central area.

19 Claims, 15 Drawing Sheets

DISPLAY DEVICE

CROSS-REFERENCE TO RELATED APPLICATION

This patent application claims priority to, and the benefit of, Korean Patent Application No. 10-2016-0127784, filed on Oct. 4, 2016, the entire contents of which are hereby incorporated by reference.

BACKGROUND

The present disclosure herein relates to a display device having improved durability against an external impact.

A display device is used for displaying an image in various devices, such as televisions, monitors, notebook computers, and mobile phones. Before display devices are released to the market, a reliability evaluation is performed under a severe condition (e.g., stress testing). Only products passing the reliability evaluation will be sold to customers.

SUMMARY

The present disclosure provides a display device in which the likelihood of a defect of a display panel caused by an external impact is reduced.

An embodiment of the inventive concept provides a display device including a first protection member including a flat part, in which a central area and a surrounding area that is adjacent the central area are defined, and a support part on the surrounding area of the flat part, and protruding upward from the flat part, a display module on the first protection member for displaying an image, and a second protection member between the first protection member and the display module, on the support part, and spaced a distance from the flat part to define a space on the central area.

The distance between the flat part and the second protection member may be substantially the same as a height of the support part.

The distance between the flat part and the second protection member may be between about 420 µm and about 1000 µm.

The display module might not overlap the support part when viewed in a plan view, and at least a portion of the support part may overlap the second protection member when viewed in the plan view.

The flat part may include a first side edge and a second side edge, which extend in one direction and face each other, and the support part may include a first sub-support portion extending along the first side edge, and a second sub-support portion extending along the second side edge and spaced apart from the first sub-support portion.

At least one of the first sub-support portion and the second sub-support portion may include a plurality of support patterns spaced apart from each other and arranged in the one direction.

The inner space may be defined by a surface of the first sub-support portion, a surface of the second sub-support portion, a top surface of the flat part, and a bottom surface of the second protection member.

The support part may have a frame shape surrounding the central area when viewed in the plan view.

The display device may further include an impact relieving member between the support part and the second protection member, and the distance between the flat part and the second protection member may be substantially the same as a sum of heights of the support part and the impact relieving member.

The impact relieving member may include an acryl-based polymer, and a polyurethane-based polymer.

The impact relieving member may overlap an entire surface of the support part when viewed in a plan view.

The impact relieving member may include a plurality of impact relieving patterns spaced apart from each other when viewed in a plan view.

The impact relieving member may have a height between about 50 µm and about 500 µm.

The second protection member may comprise a flexible bending portion, a first flat portion connected to one end of the bending portion, and having rigidity that is greater than that of the bending portion, and a second flat portion connected to an other end of the bending portion, spaced apart from the first flat portion with the bending portion therebetween, and having rigidity that is greater than that of the bending portion.

The bending portion may include a plurality of protruding patterns including the same material as that of each of the first flat portion and the second flat portion.

The first protection member may include a first sub-protection member overlapping the first flat portion when viewed in a plan view, and a second sub-protection member overlapping the second flat portion when viewed in the plan view, and spaced apart from the first sub-protection member when viewed in the plan view.

The display device may further include a third protection member below the first protection member, and including a different material than the first protection member.

The third protection member may include a first metal, and the first protection member may include plastic or a second metal that is different from the first metal.

The support part may be integrated with the flat part.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept. In the drawings.

DETAILED DESCRIPTION

Figure 1A:
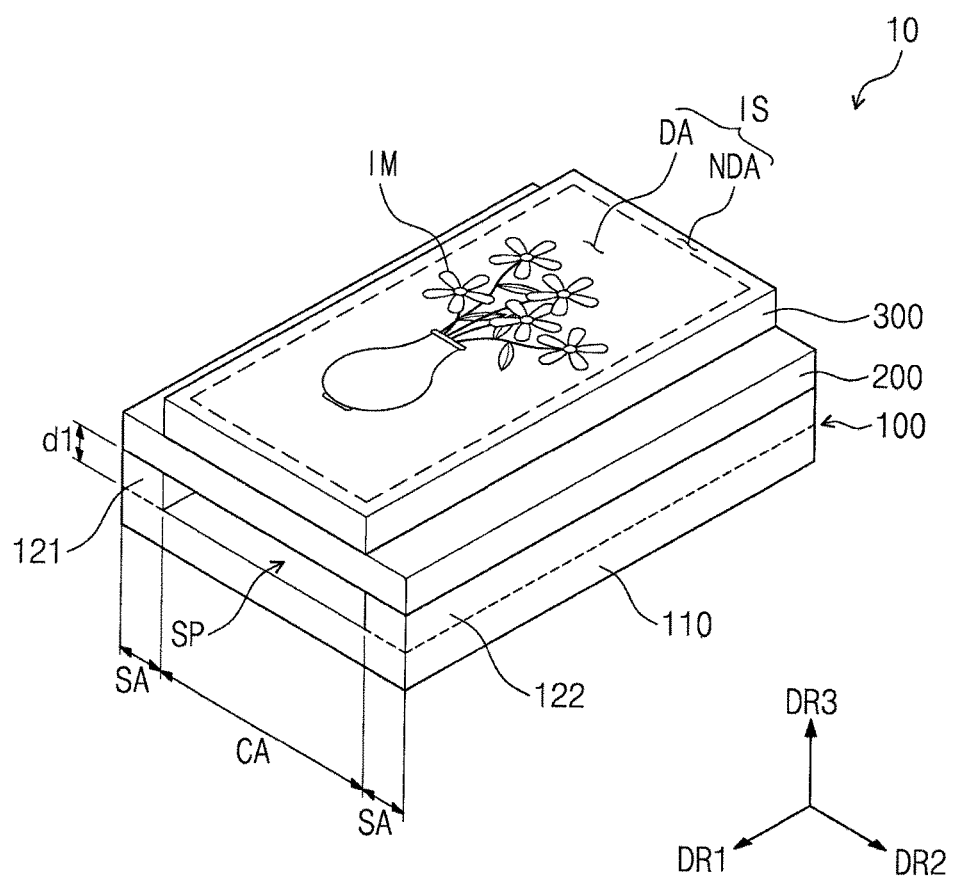
FIG. 1A is a perspective view of a display device according to an embodiment of the inventive concept.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to an embodiment of the inventive concept will be described.

Figure 1B:
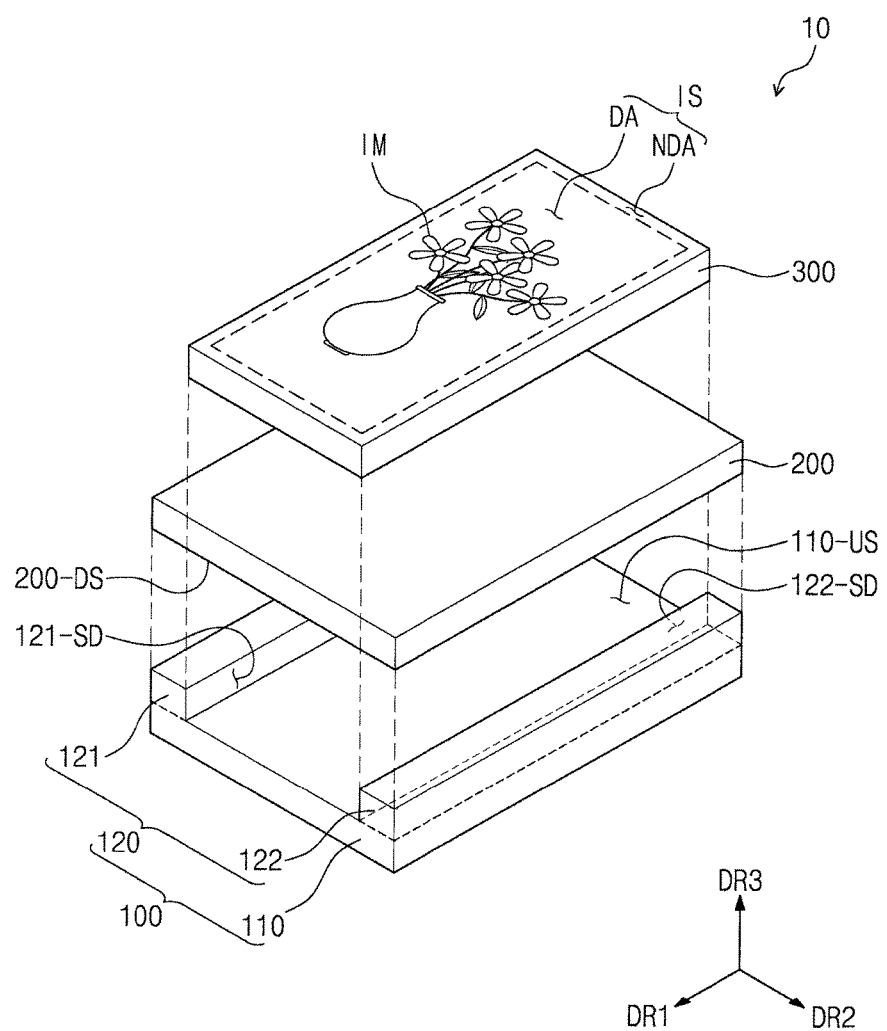
FIG. 1B is an exploded perspective view of the display device according to an embodiment of the inventive concept.

FIG. 1A is a perspective view of a display device according to an embodiment of the inventive concept. FIG. 1B is an exploded perspective view of the display device according to an embodiment of the inventive concept. Hereinafter, a display device 10 will be described with reference to FIGS. 1A and 1B.

Referring to FIGS. 1A and 1B, the display device 10 according to an embodiment of the inventive concept includes a first protection member 100, a second protection member 200, and a display module 300.

The first protection member 100 includes a flat part 110 and a support part 120. The flat part 110 is defined by a central area CA, and a surrounding area SA adjacent the central area CA. The support part 120 is located on the surrounding area SA of the flat part 110, and protrudes from the flat part 110 in an upward direction DR3. The support part 120 may include a first sub-support portion 121 and a second sub-support portion 122. The support part 120 may be integrated with the flat part 110. However, the inventive concept is not limited thereto. For example, the support part 120 may be separated from the flat part 110.

The first protection member 100 may include a material having rigidity. The first protection member 100 may include metal. However, the inventive concept is not limited thereto. For example, the first protection member 100 may include plastic.

The second protection member 200 may be located on the first protection member 100. The second protection member 200 may be located on the support part 120 of the first protection member 100. The second protection member 200 is supported by the support part 120, and is spaced apart from the flat part 110. As the second protection member 200 is spaced apart from the flat part 110, an inner space SP (e.g., a predetermined inner space) is defined on the central area CA of the flat part 110. The inner space SP may be defined by an inner surface 121-SD of the first sub-support portion 121, an inner surface 122-SD of the second sub-support portion 122, a top surface 110-US of the flat part 110, and a bottom surface 200-DS of the second protection member 200.

The second protection member 200 may overlap the support part 120 when viewed in a plan view. Although the second protection member 200 overlaps entire surfaces of the first sub-support portion 121 and the second sub-support portion 122 in FIGS. 1A and 1B, the inventive concept is not limited thereto. For example, the second protection member 200 may overlap a portion of (e.g., less than an entirety of) one or both of the first sub-support portion 121 and the second sub-support portion 122.

The second protection member 200 is spaced from (e.g., spaced a predetermined distance d1 from) the top surface 110-US of the flat part 110. The distance d1 between the second protection member 200 and the flat part 110 may be substantially the same as a height of the inner space SP. Here, "substantially same" may indicate "physically same" and/or "difference can be ignored".

The second protection member 200 is supported by the support part 120, and is spaced apart from the flat part 110. The distance d1 may be defined and maintained by the support part 120. Accordingly, the distance d1 between the second protection member 200 and the flat part 110 may be substantially the same as a height of each of the first sub-support portion 121 and the second sub-support portion 122.

The second protection member 200 may include a material having rigidity. For example, the second protection member 200 may include metal, such as aluminum or molybdenum. However, the inventive concept is not limited thereto. For example, the second protection member 200 may include various materials having an ability to radiate heat generated from the display module, and is not limited to any one embodiment.

The display module 300 is located on the second protection member 200. Accordingly, the second protection member 200 is located between the first protection member 100 and the display module 300.

The display module 300 is located on the second protection member 200. The display module 300 might not overlap the support part 120 when viewed in the plan view. The display module 300 may be located on the central area CA of the flat part 110, and might not overlap the surrounding area SA of the flat part 110 when viewed in the plan view. The display module 300 may overlap an area on which the inner space SP is defined when viewed in the plan view.

The display module 300 may have a plate shape. However, an embodiment of the inventive concept is not limited to the planar shape and size of the display module. For example, the display module 300 may have various structures. However, the display module 300 having a rectangular shape when viewed in the plan view is illustrated in FIGS. 1A and 1B as an example.

The display module 300 displays an image IM according to an electric signal. In the present specification, a display surface IS on which the image IM is displayed is parallel to a surface or plane defined by a first direction DR1 and a second direction DR2, and a normal direction of the display surface IS indicates a third direction DR3. The third direction DR3 is a reference axis differentiating a front surface and a rear surface of each of members. In the present specification, the surface defined by the first direction DR1 and the second direction DR2 may be defined as a plane, and "viewing in the plan view" may be defined by "viewing in the third direction DR3".

The display surface IS may include a display area DA and a non-display area NDA. The image IM may be displayed on the display area DA. The non-display area NDA is an area on which an image is not displayed. The non-display area NDA may surround the display area DA. The non-display area NDA may have various shapes.

The display module 300 may include a display panel. However, the inventive concept is not limited thereto. For example, the display module 300 may include an organic light emitting display panel, a liquid crystal display panel, a plasma display panel, an electrophoretic display panel, or an electrowetting display panel.

Meanwhile, the display module 300 may further include various components. For example, the display module 300 may further include a cover window and a bottom chassis.

Figure 2A:
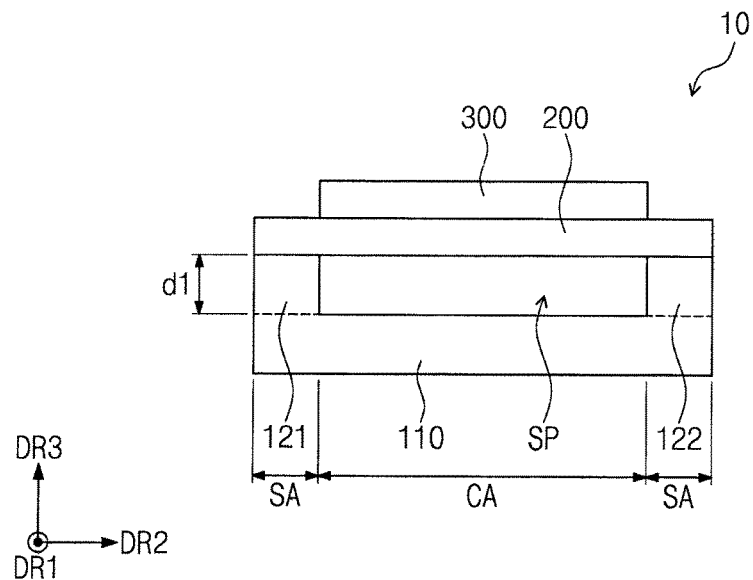
FIG. 2A is a front view of the display device according to an embodiment of the inventive concept.
Figure 2B:
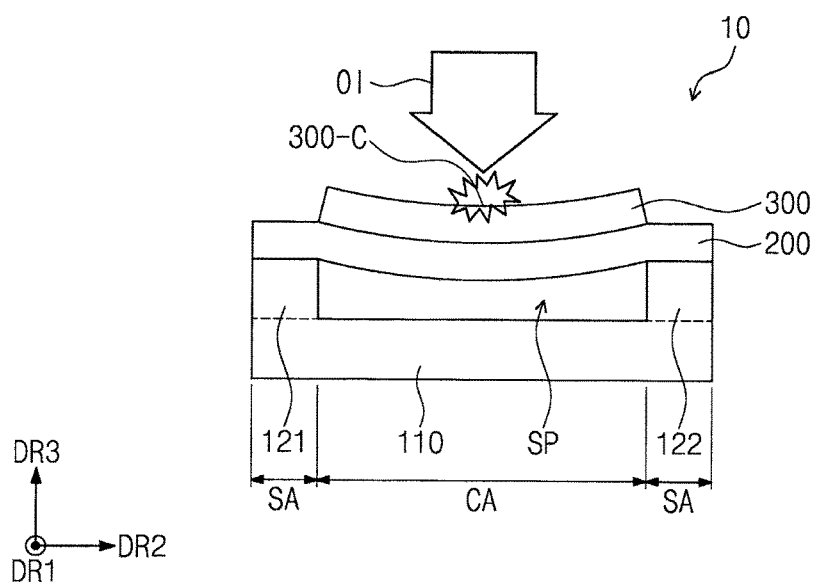
FIG. 2B is a front view of the display device when an impact is applied to the display device in FIG. 2A.

FIG. 2A is a front view of the display device according to an embodiment of the inventive concept. FIG. 2B is a front view of the display device when an impact is applied to the display device in FIG. 2A. Hereinafter, the display device 10 will be described with reference to FIGS. 2A to 2B.

The second protection member 200 and the flat part 110 may be spaced a distance (e.g., the predetermined distance d1) from each other. As the second protection member 200 is spaced apart from the flat part 110, the predetermined inner space SP is defined on the central area CA of the flat part 110.

The second protection member 200 and the flat part 110 may be spaced the predetermined distance d1 from each other to absorb an external impact OI. The distance d1 between the second protection member 200 and the flat part 110 may be equal to or greater than about 420 μm, and may be equal to or less than about 1000 μm. As the distance between the second protection member 200 and the flat part 110 satisfies the above-described range, the display device 10 may sufficiently absorb the external impact OI and still have a thin thickness to realize slimness.

For example, when the external impact OI is applied from above the display device 10 to a central portion 300-C of the display module 300, the second protection member 200 may be deflected downward. Accordingly, the distance d1 between the second protection member 200 and the flat part 110 may be reduced at the central portion 300-C to which the impact is applied.

In the display device 10 according to an embodiment of the inventive concept, the inner space SP located below the display module 300 may absorb the impact to relieve the impact applied to the display module 300. Because the display device 10 includes the inner space SP defined below the display module 300, the external impact OI may not be transmitted to the flat part 110 of the first protection member 100 located below the second protection member 200. Accordingly, because a repulsive impact returning from a lower structure to the display module 300 is reduced, the impact applied to the display module 300 may be reduced. Accordingly, the display module 300 may avoid having a defect generated therein.

As the display device 10 according to an embodiment of the inventive concept provides the inner space SP capable of absorbing the external impact to an inside overlapping the display module 300 viewed in the plan view, the display device may have improved impact resistance.

Figure 3A:
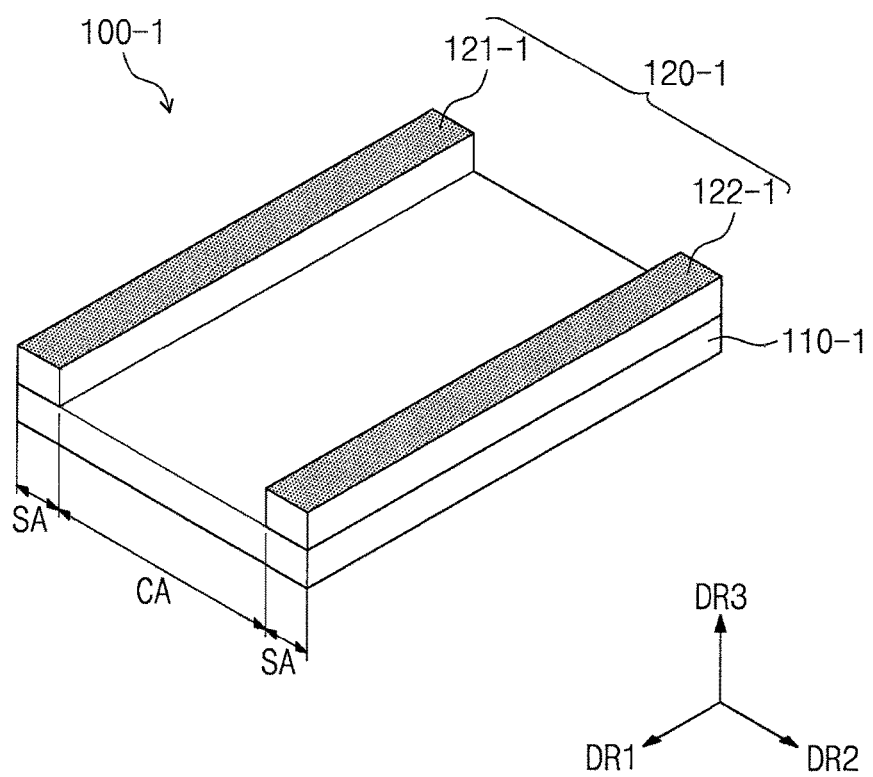
FIG. 3A is a perspective view illustrating a partial constitution of a display device according to an embodiment of the inventive concept.
Figure 3B:
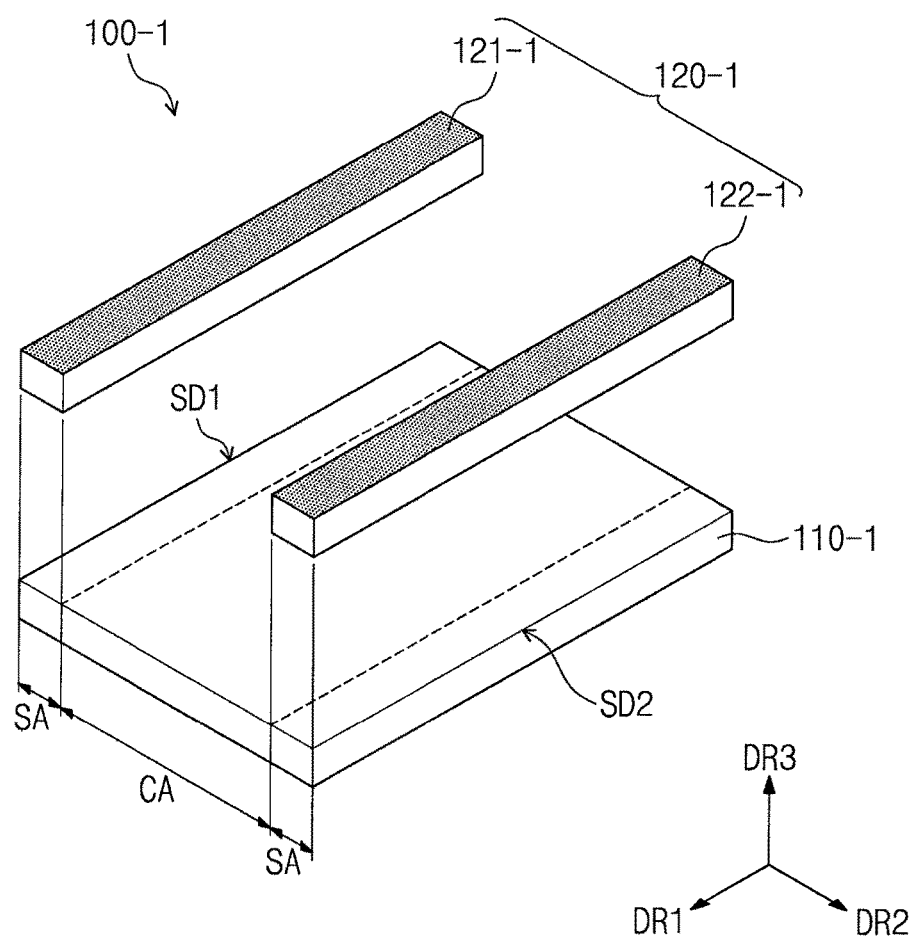
FIG. 3B is an exploded perspective view of the partial constitution of the display device in FIG. 3A.

FIG. 3A is a perspective view illustrating a partial constitution of a display device according to an embodiment of the inventive concept. FIG. 3B is an exploded perspective view of the partial constitution of the display device in FIG. 3A. Hereinafter, a first protection member 100-1 according to an embodiment of the inventive concept will be described with reference to FIGS. 3A and 3B.

As illustrated in FIGS. 3A and 3B, the first protection member 100-1 may include a flat part 110-1 and a support part 120-1, which are independent from each other. The support part 120-1 is located on the flat part 110-1.

The flat part 110-1 may have a plate shape. However, an embodiment of the inventive concept is not limited to the planar shape and size of the flat part 110-1. For example, the flat part 110-1 may have various structures. FIGS. 3A and 3B illustrate the flat part 110-1 having a rectangular shape viewed in the plan view as an example.

The flat part 110-1 may include a first side edge SD1 and a second side edge SD2. The first side edge SD1 and the second side edge SD2 may extend in the first direction DR1 and face each other in the second direction DR2. In the present embodiment, the flat part 110-1 may correspond to the flat part 110 in FIG. 1A.

The support part 120-1 may have various shapes when the support part 120-1 is a unit for supporting the second protection member 200 (refer to FIG. 1A). FIGS. 3A and 3B illustrate the support part 120-1 having a rectangular parallelepiped shape as an example. The support part 120-1 may have a rectangular parallelepiped shape having a length in the first direction DR1, which is greater than a length (e.g., width or height) in each of the second direction DR2 and the third direction DR3.

The support part 120-1 may include a first sub-support portion 121-1 and a second sub-support portion 122-1. The first sub-support portion 121-1 may extend along the first side edge SD1. The second sub-support portion 122-1 may extend along the second side edge SD2. The first sub-support portion 121-1 and the second sub-support portion 122-1 may extend in the first direction DR1 and face each other in the second direction DR2. Meanwhile, the first protection member 100-1 may further include a coupling member located between the support part 120-1 and the flat part 110-1 to couple the support part 120-1 to the flat part 110-1. The coupling member may include a physical coupling member and a chemical coupling member.

As the flat part 110-1 and the support part 120-1 are separately and independently provided, each component may have a simplified shape and may be formed through a simple process. Through this, as the process is simplified, the first protection member having various shapes may be provided.

Figure 4A:
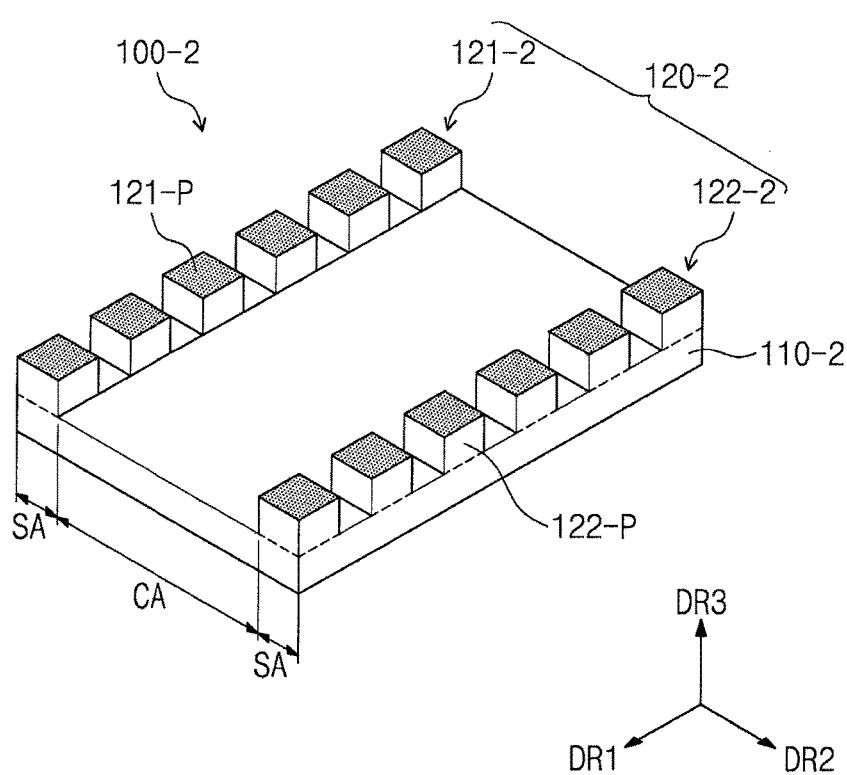
FIG. 4A is a perspective view illustrating a partial constitution of a display device according to an embodiment of the inventive concept.
Figure 4B:
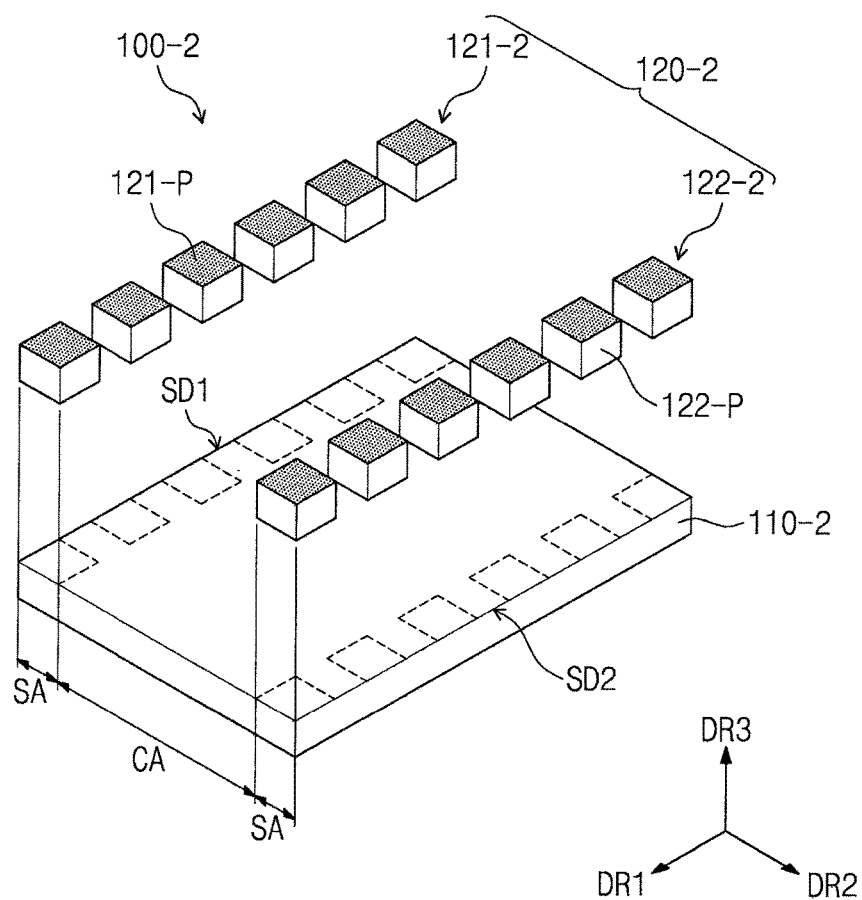
FIG. 4B is an exploded perspective view of the partial constitution of the display device in FIG. 4A.

FIG. 4A is a perspective view illustrating a partial constitution of a display device according to another embodiment of the inventive concept. FIG. 4B is an exploded perspective view of the partial constitution of the display device in FIG. 4A. Hereinafter, a first protection member 100-2 according to an embodiment of the inventive concept will be described with reference to FIGS. 4A and 4B. Hereinafter, the same elements as those described in FIGS. 3A to 3B will be designated by the same reference numerals, and overlapped description will be omitted.

At least one of a first sub-support portion 121-2 and a second sub-support portion 122-2 may include a plurality of support patterns 121-P and 122-P. The first sub-support portion 121-2 may include a plurality of first support patterns 121-P. The second sub-support portion 122-2 may include a plurality of second support patterns 122-P. The plurality of support patterns 121-P and 122-P may be independent constitutions separated from the flat part 110-2, or may be integrated with the flat part 110-2.

Although the first sub-support portion 121-2 and the second sub-support portion 122-2 respectively include a plurality of support patterns 121-P and 122-P in FIGS. 4A and 4B as an example, the inventive concept is not limited thereto. For example, one of the first sub-support portion 121-2 and the second sub-support portion 122-2 may omit patterns, and may have a structure connected in the first direction DR1.

The plurality of support patterns 121-P and 122-P may be spaced apart from each other and arranged in the first direction DR1. A distance between each of the plurality of support patterns 121-P and 122-P may be constant or different.

The plurality of support patterns 121-P and 122-P may have various shapes without limitation as long as the plurality of support patterns 121-P and 122-P are units for supporting the second protection member 200 (refer to FIG. 1A). Although the plurality of support patterns 121-P and 122-P each have a rectangular parallelepiped shape in FIGS. 4A and 4B as an example, the inventive concept is not limited thereto. For example, each of the plurality of support patterns 121-P and 122-P may have a shape of a truncated cone or a truncated pyramid.

A height of each of the plurality of support patterns 121-P and 122-P may define the distance d1 (refer to FIG. 1A) between the flat part 110-2 and the second protection member 200 (refer to FIG. 1A). Each of the plurality of support patterns 121-P and 122-P may have the same height as each other.

As the first sub-support portion 121-2 and the second sub-support portion 122-2 respectively include the plurality of support patterns 121-P and 122-P, predetermined spaces are defined between the plurality of support patterns 121-P and 122-P. Accordingly, although an impact may be applied to an outer portion of the display module 300 (refer to FIG. 1A), the impact may be absorbed by the predetermine spaces to prevent a defect from being generated in the display module 300.

Figure 5A:
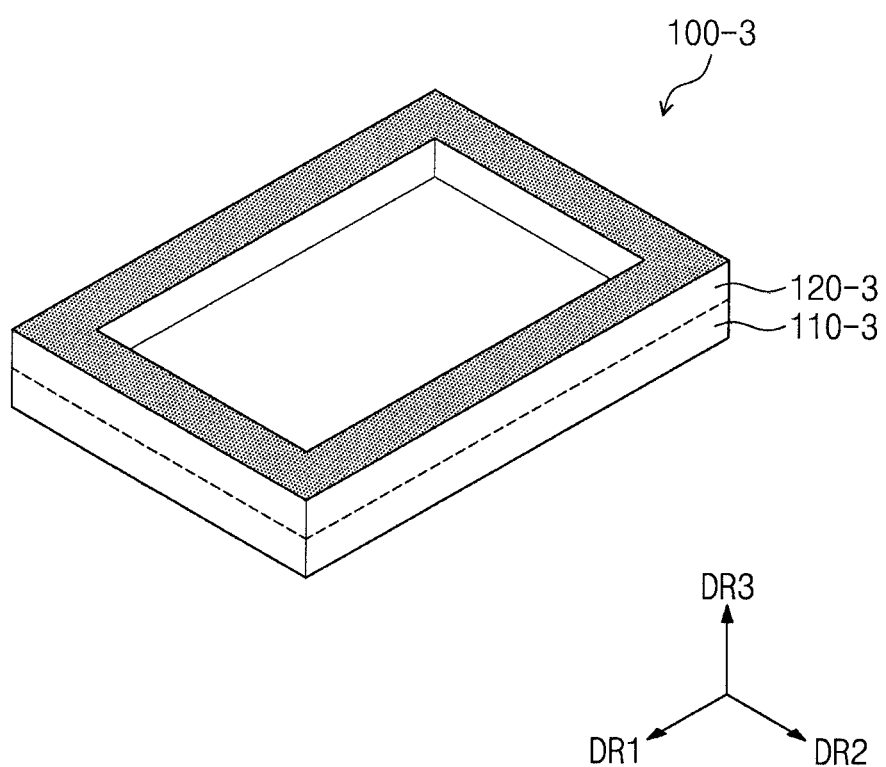
FIG. 5A is a perspective view illustrating a partial constitution of a display device according to an embodiment of the inventive concept.
Figure 5B:
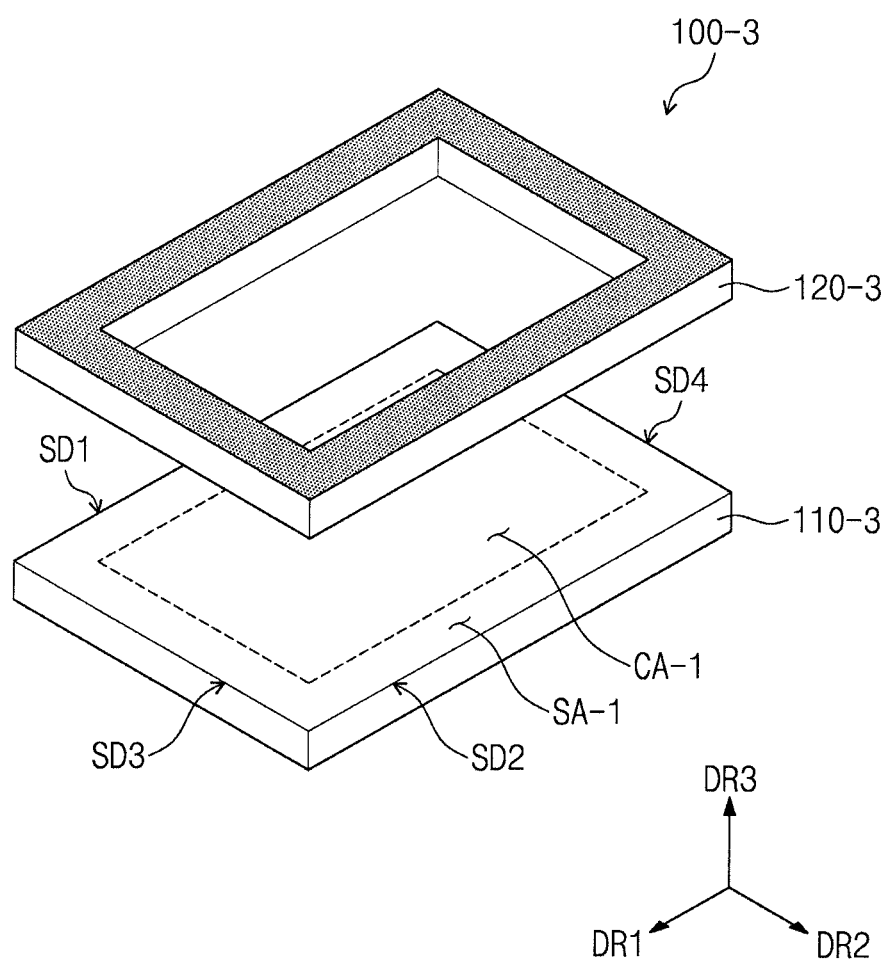
FIG. 5B is an exploded perspective view of the partial constitution of the display device in FIG. 5A.

FIG. 5A is a perspective view illustrating a partial constitution of a display device according to another embodiment of the inventive concept. FIG. 5B is an exploded perspective view of the partial constitution of the display device in FIG. 5A. Hereinafter, a first protection member 100-3 according to an embodiment of the inventive concept will be described with reference to FIGS. 5A and 5B. Meanwhile, the same elements as those described in FIGS. 3A to 3B will be designated by the same reference numerals, and overlapped description will be omitted.

A flat part 110-3 may include a first side edge SD1, a second side edge SD2, a third side edge SD3, and a fourth side edge SD4. The first side edge SD1 and the second side edge SD2 may extend in the first direction DR1 and face each other in the second direction DR2. The third side edge SD3 and the fourth side edge SD2 may extend in the second direction DR2 and face each other in the first direction DR1.

The support part 120-3 may have a frame shape surrounding a central area CA-1 of the flat part 110-3. The support part 120-3 may be located on a surround area SA-1 of the flat part 110 to surround an edge of the flat part 110-3 when viewed in the plan view. The support part 120-3 may extend along the first side edge SD1, the second side edge SD2, the third side edge SD3, and the fourth side edge SD4 of the flat part 110-3 to surround the central area CA-1.

As the support part 120-3 surrounds the central area CA-1 of the flat part 110-3, the inner space SP (refer to FIG. 1A) defined between the flat part 110-3 and the second protection member 200 (refer to FIG. 1A) may be surrounded by the support part 12Q-3. Accordingly, the inner space may not be exposed to the outside to prevent foreign substances from being introduced.

Figure 6A:
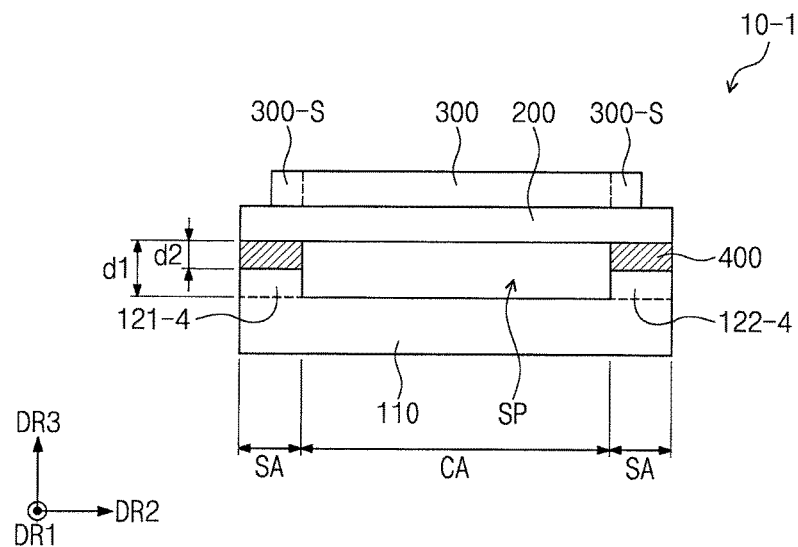
FIG. 6A is a front view of a display device according to an embodiment of the inventive concept.
Figure 6B:
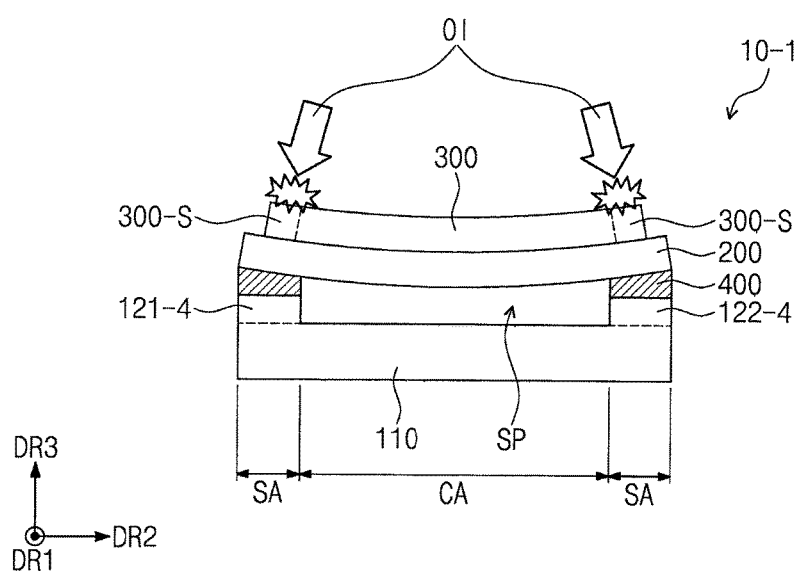
FIG. 6B is a front view of the display device when an impact is applied to the display device in FIG. 6B.

FIG. 6A is a front view of a display device according to another embodiment of the inventive concept. FIG. 6B is a front view of the display device when an impact is applied to the display device in FIG. 6A. FIGS. 6A and 6B illustrate a display device 10-1 in which another element is added to the display device 10 in FIGS. 2A and 2B. Hereinafter, the same elements as those described in FIGS. 2A to 2B will be designated by the same reference numerals, and overlapped description will be omitted.

Referring to FIGS. 6A and 6B, the display device 10-1 according to an embodiment of the inventive concept may further include an impact relieving member 400 located between the support part 120-4 (e.g., first sub-support portion 121-4 and second sub-support portion 122-4) and the second protection member 200.

The impact relieving member 400 may overlap the support part 120-4. The impact relieving member 400 may overlap a first sub-support portion 121-4 and a second sub-support portion 122-4. Although the impact relieving member 400 overlaps an entire surface of the surrounding area SA of the flat part 110 in FIGS. 6A and 6B, the inventive concept is not limited thereto. For example, the impact relieving member 400 may overlap a portion/less than an entirety of the surrounding area SA.

The impact relieving member 400 may include a material capable of absorbing an impact applied from the outside. For example, the impact relieving member 400 may include acryl-based polymer or polyurethane-based polymer.

In the display device 10-1 according to an embodiment of the inventive concept, the distance d1 between the second protection member 200 and the flat part 110 may be substantially the same as the sum of the heights of the support part 120-4 and the impact relieving member 400. The impact relieving member 400 may have a height d2 equal to or greater than about 50 μm, and equal to or less than about 500 μm. However, the inventive concept is not limited thereto. For example, the impact relieving member 400 may have the height d2 varied according to a degree of impact absorbance of a material constituting the impact relieving member 400.

The display module 300 is located on the second protection member 200. The display module 300 may overlap a portion of the support part 120-4 when viewed in the plan view. The display module 300 may overlap a portion of the surrounding area SA when viewed in the plan view. The display module 300 may overlap a portion of the impact relieving member 400 when viewed in the plan view. An outer portion 300-S of the display module 300 may overlap a portion of the impact relieving member 400 when viewed in the plan view.

When an external impact OI is applied to the outer portion 300-S of the display module 300, the impact may be absorbed by the impact relieving member 400. When the external impact OI is applied to the outer portion 300-S, a shape of the impact relieving member 400 may be changed. As the shape of the impact relieving member 400 is changed, the external impact OI is not transmitted to the first protection member 100, and is instead absorbed by the impact relieving member 400. Accordingly, although the impact is applied to the outer portion 300-S of the display module 300, the impact relieving member 400 may prevent a defect from being generated in the display module 300.

As the external impact is applied to the outer portion 300-S of the display module 300 in the display device 10-1, the outer portion 300-S of the display module 300 may overlap a portion of the support part 120-4 when viewed in the plan view. Accordingly, as the display module 300 increases in planar surface area, an image may be played through the wider display area DA (refer to FIG. 1A).

Figure 7A:
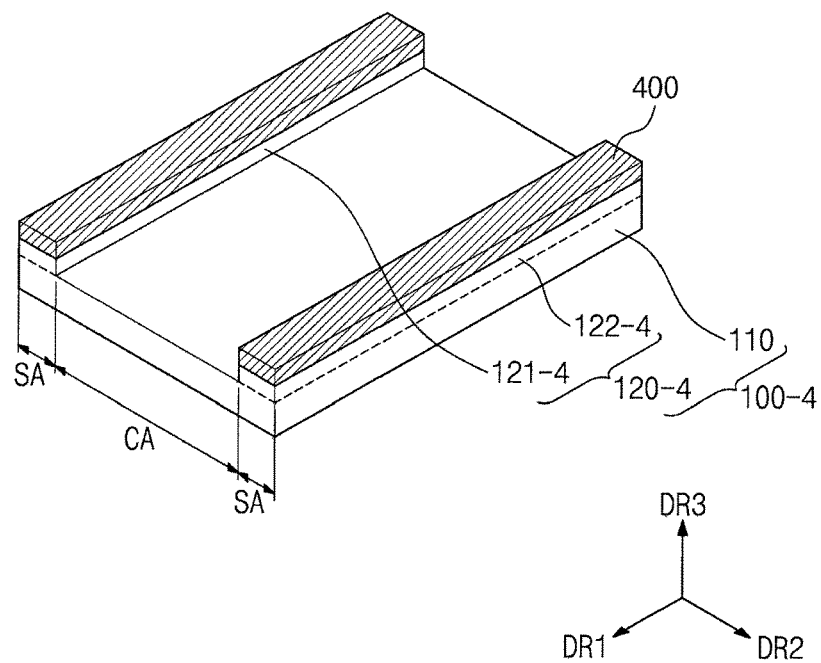
FIG. 7A is a perspective view illustrating a partial constitution of a display device according to another embodiment of the inventive concept.
Figure 7B:
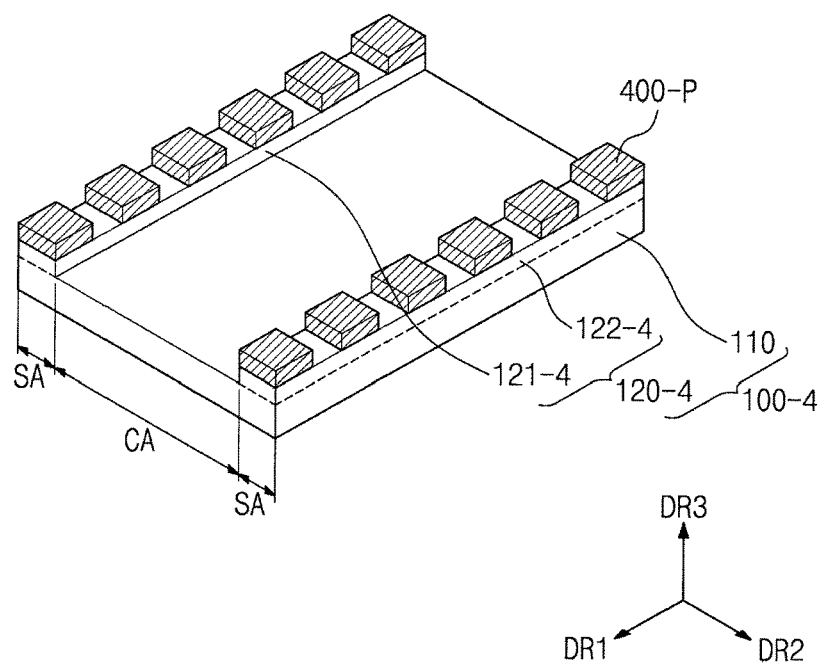
FIG. 7B is a perspective view illustrating a partial constitution of a display device according to an embodiment of the inventive concept.

FIG. 7A is a perspective view illustrating a partial constitution of a display device according to an embodiment of the inventive concept. FIG. 7B is a perspective view illustrating a partial constitution of a display device according to an embodiment of the inventive concept. FIGS. 7A and 7B illustrate a display device in which another component is added to the first protection member in FIGS. 1A and 1B. Hereinafter, a first protection member 100-4 to which the impact relieving member 400 is added will be described with reference to FIG. 7A. Meanwhile, the same elements as those described in FIGS. 1A to 1B will be designated by the same reference numerals, and overlapped description will be omitted.

The display device according to an embodiment of the inventive concept may further include the impact relieving member 400 located on the first protection member 100-4. The impact relieving member 400 may be located on a support part 120-4. The impact relieving member 400 may be located on the surrounding area SA of the flat part 110.

The impact relieving member 400 may be located on the support part 120-4 and overlap an entire surface of the support part 120-4 when viewed in the plan view. Accordingly, the impact relieving member 400 may have a shape corresponding to the support part 120-4 when viewed in the plan view.

For example, as illustrated in FIG. 7A, the impact relieving member 400 may be provided in plurality and may be located on each of a first sub-support portion 121-4 and a second sub-support portion 122-4. The plurality of impact relieving members 400 may overlap entire surfaces of the first sub-support portion 121-4 and the second sub-support portion 122-4, respectively. Each of the plurality of impact relieving members 400 may have a shape identically corresponding to that of a respective one of the first sub-support portion 121-4 and the second sub-support portion 122-4 when viewed in the plan view.

Alternatively, as illustrated in FIG. 7B, an impact relieving member 400 may have a shape that is different from that of the support part 120-4 when viewed in the plan view. Referring to FIG. 7B, the impact relieving member 400 may include a plurality of impact relieving patterns 400-P spaced apart from each other when viewed in the plan view. The plurality of impact relieving patterns 400-P may be spaced apart from each other and arranged in the first direction DR1. A distance between each of the plurality of impact relieving patterns 400-P may be constant or different/varied.

Although each of the impact relieving members 400 located on the first sub-support portion 121-4 and the second sub-support portion 122-4 includes the plurality of impact relieving patterns 400-P in FIG. 7B, the inventive concept is not limited thereto. For example, one of the impact relieving members 400 located on the first sub-support portion 121-4 and the second sub-support portion 122-4 may overlap an entire surface of the support part 120-4 without including the impact relieving patterns 400-P.

The plurality of impact relieving patterns 400-P may be located on the support part 120-4 to substantially support the second protection member 200. The sum of the heights of the support part 120-4 and each of the impact relieving patterns 400-P may define the distance d1 (refer to FIG. 1A) between the flat part 110 and the second protection member 200 (refer to FIG. 1A). Each of the plurality of impact relieving patterns 400-P may have substantially the same height as each other.

As the impact relieving member 400 is located on the support part 120-4, an external impact applied from above the display module may be absorbed by the impact relieving member 400. Accordingly, the display module 300 may be prevented from being damaged by the external impact. An embodiment of the inventive concept is not limited to the kinds of the impact relieving member 400. For example, the impact relieving member 400 may have various shapes.

Figure 8:
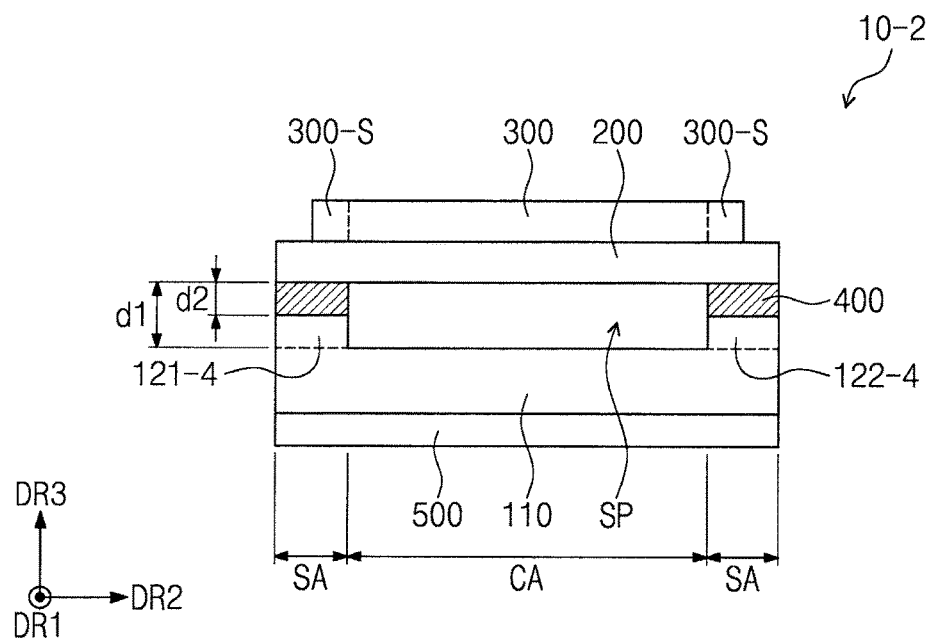
FIG. 8 is a front view of a display device according to an embodiment of the inventive concept.

FIG. 8 is a front view of a display device according to another embodiment of the inventive concept. FIG. 8 illustrates a display device in which another component is added to the display device in FIG. 6A. Hereinafter, the same elements as those described in FIG. 6A will be designated by the same reference numerals, and overlapped description will be omitted.

Referring to FIG. 8, a display device 10-2 according to an embodiment of the inventive concept may further include a third protection member 500 located below the first protection member 100-4 (refer to FIG. 7A).

The third protection member 500 may include a material that is different than that of the first protection member 100-4. The third protection member 500 may include a material having rigidity. The third protection member 500 may include a first metal. However, the inventive concept is not limited thereto. For example the third protection member 500 may include stainless steel (SUS).

The first protection member 100-4 may include a material that is different from that of the third protection member 500. The first protection member 100-4 may include a relatively flexible material that is more flexible than that of the third protection member 500. The first protection member 100-4 may include a second metal that is more flexible than the first metal contained in the third protection member 500, or may include plastic.

As the third protection member 500 including the material having rigidity that is relatively greater than that of the first protection member 100-4 is located below the first protection member 100-4, the display device 10-2 is able to endure impact applied from therebelow to improve reliability of the display device 10-2.

Figure 9A:
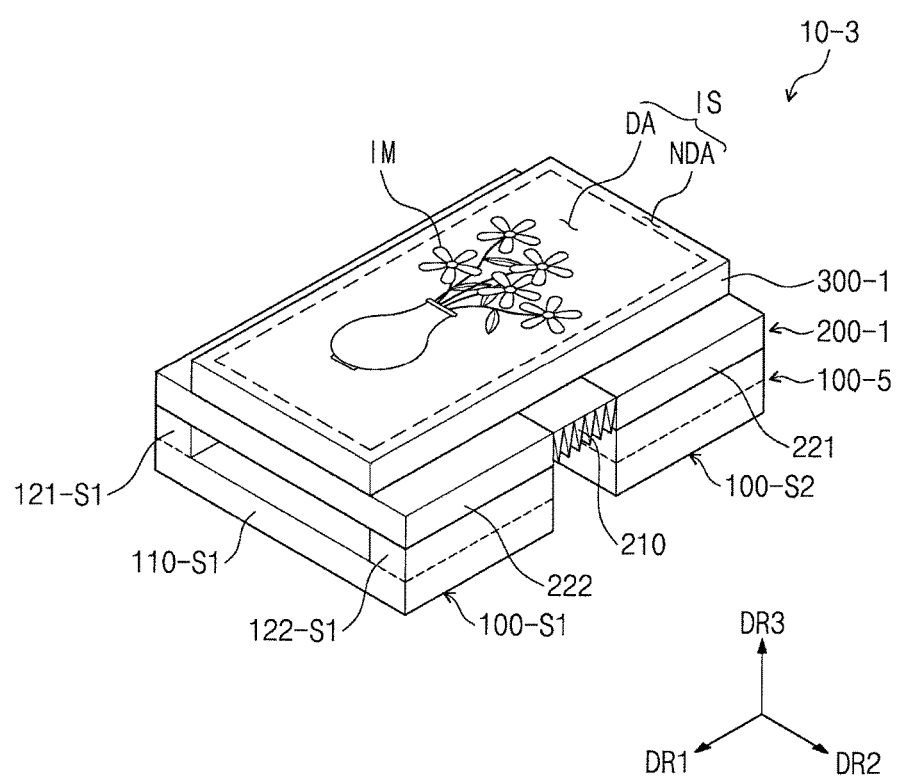
FIG. 9A is a perspective view of a display apparatus according to an embodiment of the inventive concept.
Figure 9B:
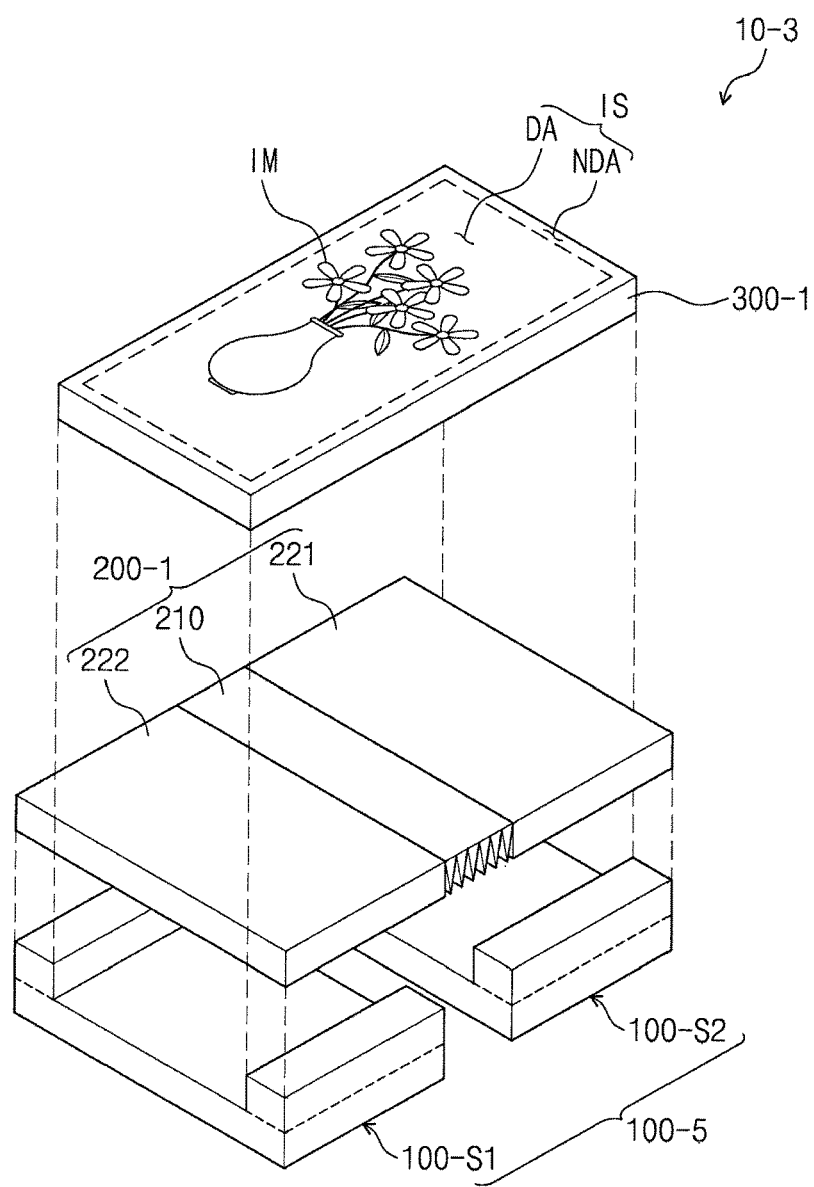
FIG. 9B is an exploded perspective view of the display device according to an embodiment of the inventive concept.

FIG. 9A is a perspective view of a display apparatus according to an embodiment of the inventive concept. FIG. 9B is an exploded perspective view of the display device according to an embodiment of the inventive concept. Hereinafter, a display device 10-3 will be described with reference to FIGS. 9A and 9B. Meanwhile, the same elements as those described in FIGS. 1A and 1B will be designated by the same reference numerals, and overlapped description will be omitted.

Referring to FIGS. 9A and 9B, the display device 10-3 according to an embodiment of the inventive concept includes a first protection member 100-5, a second protection member 200-1, and a display module 300-1.

The first protection member 100-5 may include a first sub-protection member 100-S1 and a second sub-protection member 100-S2. The first sub-protection member 100-S1 and the second sub-protection member 100-S2 may be spaced apart from each other when viewed in the plan view. The first sub-protection member 100-S1 S1 and the second sub-protection member 100-S2 may be spaced apart from each other in the first direction DR1.

The second protection member 200-1 may be bent or folded with respect to an axis extending in one direction. In the present embodiment, the second protection member is bendable with respect to a bending axis extending in the second direction DR2, as an example.

The second protection member 200-1 may include a first flat portion 221, a bending portion 210, and a second flat portion 222, which are arranged in the first direction DR1. The bending portion 210 may be relatively more flexible than each of the first flat portion 221 and the second flat portion 222. The second protection member 200-1 may be bent or folded by the bending portion 210.

The bending portion 210 may be bent or folded in various manners. For example, the bending portion 210 may include a material having high flexibility. Alternatively, the bending portion 210 may have a shape that may be changed by external force.

The first flat portion 221 may be connected to one end of the bending portion 210. The first flat portion 221 may have rigidity that is greater than the bending portion 210. The second flat portion 222 may be connected to the other end of the bending portion 210, and may be spaced apart from the first flat portion 221 with the bending portion 210 therebetween in the first direction DR1. The second flat portion 222 may have greater rigidity than the bending portion 210.

The first sub-protection member 100-S1 may overlap the first flat portion 221. The first flat portion 221 may overlap an entire surface of the first sub-protection member 100-S1. The second sub-protection member 100-S2 may overlap the second flat portion 222. That is, the second flat portion 222 may overlap an entire surface of the second sub-protection member 100-S2.

The display module 300-1 is located on the second protection member 200-1. The display module 300-1 may be flexible. "Flexibility" may represent a bendable characteristic, and may include various structures (e.g., from a structure completely folded, to a structure bendable at a several nanometer).

The display device 10-3 according to an embodiment of the inventive concept will be described in more detail in FIGS. 10A and 10B.

Figure 10A:
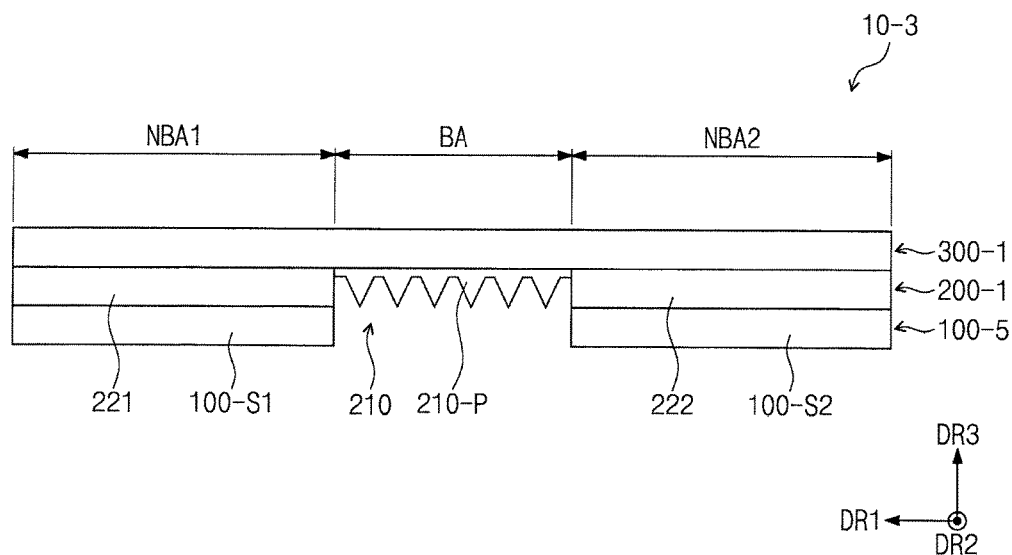
FIG. 10A is a side view illustrating a flat mode of the display device in FIG. 9A.

FIG. 10A is a side view illustrating a flat mode of the display device in FIG. 9A. FIG. 10B is a side view illustrating a bending mode of the display device in FIG. 9A. Hereinafter, the display device 10-3 will be described with reference to FIGS. 10A to 10B.

Figure 10B:
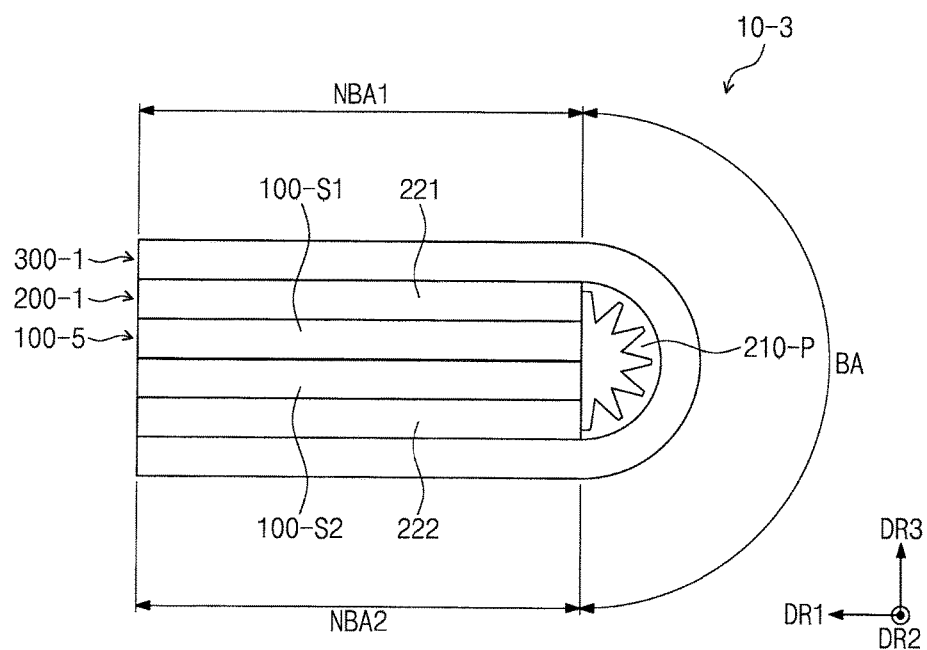
FIG. 10B is a side view illustrating a bending mode of the display device in FIG. 9A.

Referring to FIGS. 10A and 10B, the display device 10-3 may operate in the flat mode and the bending mode.

The display device 10-3 may include a bending area BA, a first non-bending area NBA1, and a second non-bending area NBA2. The bending portion 210 of the second protection member 200-1 may overlap the bending area BA. The first flat portion 221 of the second protection member 200-1 may overlap the first non-bending area NBA1, and the second flat portion 222 may overlap the second non-bending area NBA2.

The bending portion 210 may include the same material as that of each of the first flat portion 221 and the second flat portion 222. The bending portion 210 may be substantially integrated with the first flat portion 221 and the second flat portion 222.

The bending portion 210 may include a plurality of protruding patterns 210-P. The plurality of protruding patterns 210-P of the bending portion 210 extend along the second direction DR2, and provide grooves or spaces arranged in the first direction DR1.

The plurality of protruding patterns 210-P may have various shapes on a cross-section defined by the first direction DR1 and the third direction DR3. For example, each of the plurality of protruding patterns 210-P may have a shape of a triangle, an isosceles trapezoid, or a semi-circle on the cross-section. FIGS. 10A and 10B exemplarily illustrate the plurality of protruding patterns 210-P each having a triangular shape on the cross-section.

As illustrated in FIG. 10B, the display device 10-3 may be bent or folded to expose a top surface of the display module 300 to the outside.

The first protection member 10Q-5 may include the first sub-protection member 100-S1 and the second sub-protection member 100-S2. The first sub-protection member 100-S1 and the second sub-protection member 100-S2 may be spaced apart from each other in the first direction DR1. As The first sub-protection member 100-S1 and the second sub-protection member 100-S2 are spaced apart from each other, the first protection member 100-5 having rigidity may remain unbroken when an outer side thereof is bent.

The second protection member 200-1 may include the bending portion 210, and the bending portion 210 may include a plurality of protruding patterns 210-P. As a distance (e.g., a predetermined distance) is defined between the plurality of protruding patterns 210-P, and as the distance between the plurality of protruding patterns 210-P decreases when the display device is bent or folded, stress caused by the bending and applied to each of the protruding patterns 210-P may be reduced. Accordingly, when the outer side is bent, the second protection member 200-1 having rigidity may not be broken.

The display device according to the embodiment of the inventive concept may prevent damage to the display panel from otherwise being generated by the external impact.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Hence, the real protective scope of the present invention shall be determined by the technical scope of the accompanying claims and their functional equivalents.

What is claimed is:

1. A display device comprising:
   a first protection member comprising:
   a flat part, in which a central area and a surrounding area that is adjacent the central area are defined; and
   a support part on the surrounding area of the flat part, and protruding upward from the flat part;
   a display module on the first protection member for displaying an image on a front surface; and
   a second protection member comprising a bottom surface, and a top surface opposing the front surface of the display module, and being between the first protection member and the display module, on the support part, and spaced a distance from the flat part to define a space on the central area wherein side surfaces of the display module that extend in a same direction as the support part and do not overlap with the support part when viewing the front surface are exposed above the top surface of the second protection member.

2. The display device of claim 1, wherein the distance between the flat part and the second protection member is substantially the same as a height of the support part.

3. The display device of claim 2, wherein the distance between the flat part and the second protection member is between about 420 μm and about 1000 μm.

4. The display device of claim 1, wherein the display module does not overlap the support part when viewed in a plan view, and
   wherein at least a portion of the support part overlaps the second protection member when viewed in the plan view.

5. The display device of claim 4, wherein the flat part comprises a first side edge and a second side edge, which extend in one direction and face each other, and
   wherein the support part comprises:
   a first sub-support portion extending along the first side edge; and
   a second sub-support portion extending along the second side edge and spaced apart from the first sub-support portion.

6. The display device of claim 5, wherein at least one of the first sub-support portion and the second sub-support portion comprises a plurality of support patterns spaced apart from each other and arranged in the one direction.

7. The display device of claim 5, wherein the space is defined by a surface of the first sub-support portion, a surface of the second sub-support portion, a top surface of the flat part, and the bottom surface of the second protection member.

8. The display device of claim 4, wherein the support part has a frame shape surrounding the central area when viewed in the plan view.

9. The display device of claim 1, further comprising an impact relieving member between the support part and the second protection member,
   wherein the distance between the flat part and the second protection member is substantially the same as a sum of heights of the support part and the impact relieving member.

10. The display device of claim 9, wherein the impact relieving member comprises an acryl-based polymer, and a polyurethane-based polymer.

11. The display device of claim 9, wherein the impact relieving member overlaps an entire surface of the support part when viewed in a plan view.

12. The display device of claim 9, wherein the impact relieving member comprises a plurality of impact relieving patterns spaced apart from each other when viewed in a plan view.

13. The display device of claim 9, wherein the impact relieving member has a height between about 50 μm and about 500 μm.

14. The display device of claim 1, wherein the second protection member comprises:
   a flexible bending portion;
   a first flat portion connected to one end of the bending portion, and having rigidity that is greater than that of the bending portion; and
   a second flat portion connected to an other end of the bending portion, spaced apart from the first flat portion with the bending portion therebetween, and having rigidity that is greater than that of the bending portion.

15. The display device of claim 14, wherein the bending portion comprises a plurality of protruding patterns comprising the same material as that of each of the first flat portion and the second flat portion.

16. The display device of claim 14, wherein the first protection member comprises:
   a first sub-protection member overlapping the first flat portion when viewed in a plan view; and
   a second sub-protection member overlapping the second flat portion when viewed in the plan view, and spaced apart from the first sub-protection member when viewed in the plan view.

17. The display device of claim 1, further comprising a third protection member below the first protection member, and comprising a different material than the first protection member.

18. The display device of claim 17, wherein the third protection member comprises a first metal, and
   wherein the first protection member comprises plastic or a second metal that is different from the first metal.

19. The display device of claim 1, wherein the support part is integrated with the flat part.

\* \* \* \* \*